(12) United States Patent
Neumann et al.

(10) Patent No.: US 11,700,696 B2
(45) Date of Patent: Jul. 11, 2023

(54) BURIED ELECTRICAL DEBUG ACCESS PORT

(71) Applicant: Intel Corporation, Santa Clara, CA (US)

(72) Inventors: Florence R. Neumann, Folson, CA (US); Bilal Khalaf, Folsom, CA (US); Saeed S. Shojaie, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 17/338,450

(22) Filed: Jun. 3, 2021

(65) Prior Publication Data

US 2021/0298183 A1 Sep. 23, 2021

Related U.S. Application Data

(62) Division of application No. 15/089,385, filed on Apr. 1, 2016, now Pat. No. 11,064,612.

(51) Int. Cl.
*H05K 1/18* (2006.01)
*H05K 3/28* (2006.01)
*G01R 31/28* (2006.01)

(52) U.S. Cl.
CPC ......... *H05K 3/284* (2013.01); *G01R 31/2818* (2013.01); *H01L 2224/16225* (2013.01);
(Continued)

(58) Field of Classification Search
CPC .... H05K 1/185; H05K 2201/10; H01L 23/28; H01L 21/56; H01L 31/0203;
(Continued)

(56) References Cited

U.S. PATENT DOCUMENTS 7,230,309 B2 * 6/2007 Bauer .................... H01L 23/66
                                                                    257/434
7,511,299 B1 * 3/2009 Alexander ............. H01L 23/66
                                                                    257/48
(Continued)

FOREIGN PATENT DOCUMENTS

KR     10-2008-0000879     1/2014

OTHER PUBLICATIONS

International Search Report and Written Opinion for International Patent Application No. PCT/US2017/017238 dated May 19, 2018, 13 pages.

(Continued)

*Primary Examiner* — Binh B Tran
(74) *Attorney, Agent, or Firm* — Schwabe, Williamson & Wyatt P.C.

(57) ABSTRACT

Embodiments are generally directed to a buried electrical debug access port. An embodiment of an apparatus includes a substrate or printed circuit board; one or more electronic components coupled with the substrate or printed circuit board; one or more electrical access ports coupled with the substrate or printed circuit board, each electrical access port including electrically conductive material; and an encapsulant material, the encapsulant material encapsulating the one or more access ports, wherein the one or more access ports are electrically connected to one or more circuits of the apparatus to provide debugging access to the apparatus.

13 Claims, 7 Drawing Sheets

(52) U.S. Cl.
CPC .............. *H01L 2924/15311* (2013.01); *H01L 2924/181* (2013.01)

(58) Field of Classification Search
CPC ....... H01L 31/048; H01L 33/52; H01L 33/56; H01L 23/3135; H01L 23/3192; H01L 31/0488
See application file for complete search history.

(56) References Cited

U.S. PATENT DOCUMENTS

| | | |
|---|---|---|
| 9,978,688 B2 * | 5/2018 | Yen .......................... H01L 24/97 |
| 2013/0330846 A1 | 12/2013 | Tang et al. |
| 2014/0002998 A1 | 1/2014 | Pidwerbecki et al. |
| 2015/0228550 A1 | 8/2015 | Yu et al. |

OTHER PUBLICATIONS

International Preliminary Report on Patentability for International Patent Application No. PCT/US2017/017238 dated Oct. 11, 2018, 10 pages.

* cited by examiner

BURIED ELECTRICAL DEBUG ACCESS PORT

CROSS-REFERENCE TO RELATED APPLICATIONS

This application is a division of U.S. patent application Ser. No. 15/089,385, filed on Apr. 1, 2016, the entire contents of which is hereby incorporated by reference herein.

TECHNICAL FIELD

Embodiments described herein generally relate to the field of electronic devices and, more particularly, a buried electrical debug access port.

BACKGROUND

In the construction of mobile electronic devices, such as laptop, two in one, and tablet computers, there is a continued trend for thinner devices, new devices being only a fraction of the thickness of similar devices in the past.

The reduction in size of devices includes a need to reduce size of data storage devices such as solid state drives (SSDs), wherein the SSD may be included in a system in package (SiP) to be, for example, soldered into a motherboard of an apparatus or system.

However, in addition to the need to reduce the size of an SiP or similar electronic package, there is also the need to provide debug access to the package when failure conditions occur. Reducing size and providing debug access may be opposing factors because the reduction in size of the package creates difficulty in providing debug access because the placement of conventional access ports requires a certain amount of space surrounding the electronic package for debug signals to be routed from beneath the package to test points on the motherboard.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
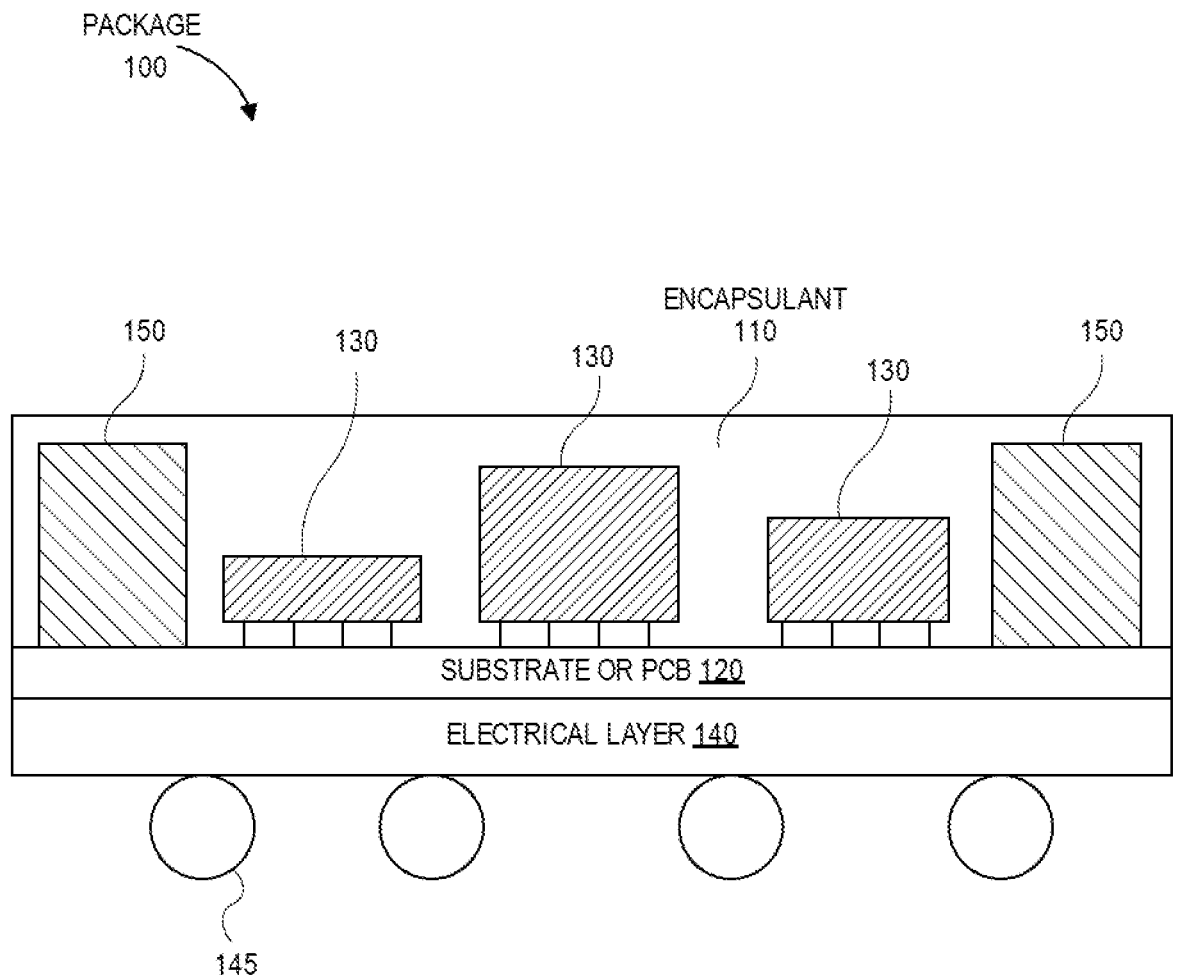
FIG. 1 is an illustration of an implementation of a package with one or more buried access ports according to an embodiment.

Embodiments described herein are generally directed to a buried electrical debug access port.

For the purposes of this description, the following definitions apply:

"Package" or "electronic package" refers to an apparatus including one or more electronic devices that are sealed at least in part with one or more encapsulant materials.

"Mobile device" or "mobile electronic device" refers to a tablet computer, 2-in-1 or detachable computer, smartphone, notebook or laptop computer, handheld computer, mobile Internet device, or other mobile electronic device that includes processing capability.

In some embodiments, an apparatus or system a buried electrical debug access port for an electronic package.

There is a shift in the industry to thinner mobile electronic devices, including laptop computers, 2-in-1 computers, and tablet computer. As such, there is a need to miniaturize the entire platform including the solid state drive (SSD) storage. SSD miniaturization efforts may include fabrication of, for example, system in package (SiP) solutions. As referred to herein, a system in package may include, but is not limited to, a fully integrated (including ASIC, Application-Specific Integrated Circuit; DRAM (Dynamic Random Access Memory) memory; power; and other elements) solutions in a single BGA (Ball Grid Array) package, wherein the package may be soldered down onto a motherboard in an apparatus or system. Further, many other types of systems may be miniaturized into similar packages, including, but not limited to, DRAM (Dynamic Random Access Memory) and other memory technologies. Further, packages may include other structures, including varying surface mount technologies such as, for example, LGA (Land Grid Array) and PGA (Pin Grid Array) packages.

However, a problem arises in providing storage debug while the BGA or other mounting technology of a package is soldered down on a motherboard or platform. Because the package is fully encapsulated, there is no conventional means to access internal circuitry, which proves to be a serious problem for packages such as SiPs where system level debug is more difficult to perform than in SSDs that are removable from the platform.

In some embodiments, an apparatus or system includes one or more buried electrical debug access ports within a package. In some embodiments, the one or more buried access ports are electrically connected to one or more circuits of the apparatus or system, and allow for access to signals for debugging in a completed apparatus or system without requiring inclusion of external access ports or other electrical contacts.

In some embodiments, access to the one or more buried access ports is made by breaking through the encapsulate material for the apparatus or system, the one or more access ports being fully encapsulated by the encapsulant material of the apparatus or system. In some embodiments, access to the one or more buried access ports is make by electromagnetic coupling with one or more ports which may allow accessing signals without breaking through encapsulate material. In some embodiments, an apparatus, system, or method allow for debugging a fully encapsulated IC package, including a package that is soldered down in place on a system board.

FIG. 1 is an illustration of an implementation of a system in package with one or more buried access ports according to an embodiment. In some embodiments, a package 100, such as a system in package (SiP), includes a substrate or printed circuit board (PCB) 120. For illustration, FIG. 1 provides an example system with a certain package structure. However, embodiments are not limited to a particular type of electronic package. Multiple electronic components of varying size 130 are installed on the substrate or PCB 120, with the components being encapsulated by the package encapsulant material 110. The package 100 may further include an electrical layer 140 to provide interconnection with a ball grid array 145 or other similar connections, such as, for example, a land grid array or pin grid array.

In some embodiments, the package further includes one or more debug electrical access ports 150, wherein the access ports are also encapsulated. In some embodiments, the access ports 150 provide electrical connection to access signals within the system in package to allow for debugging of the system by drilling through, piercing through, or otherwise breaking through the encapsulant to access the access ports. In some embodiments, the access ports 150 provide access to signals by electromagnetic coupling with one or more ports.

Figure 2:
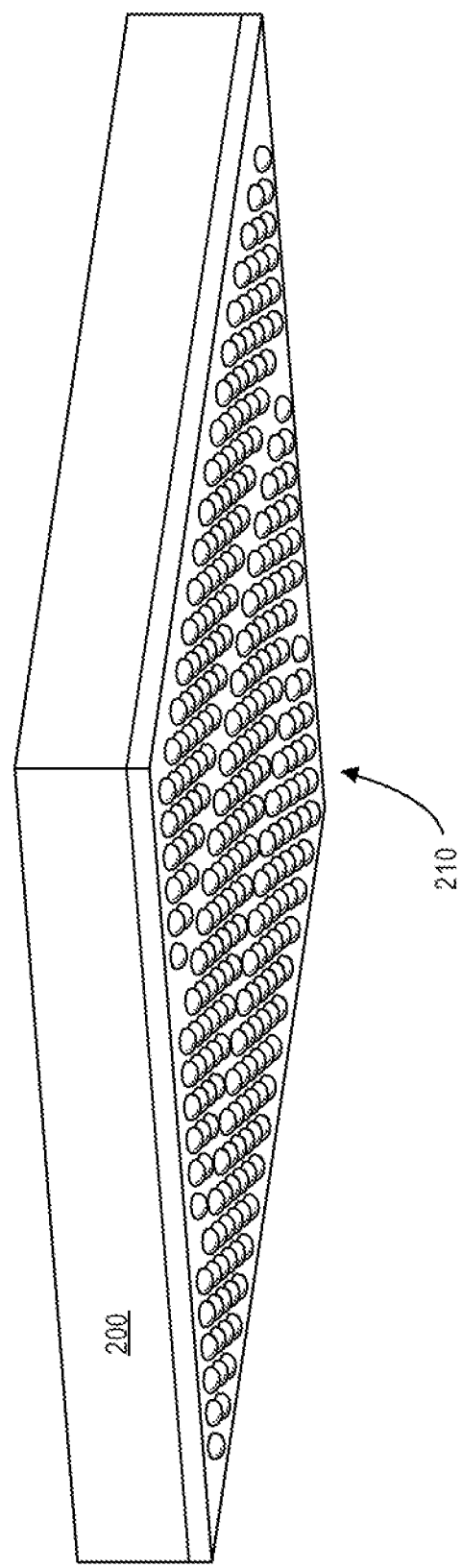
FIG. 2 is an illustration of an implementation of a system in package.

FIG. 2 is an illustration of an implementation of a system in package. In this illustration, an entire system (including, for example, ASIC, DRAM, other memory power, etc.) in package (SiP) 200 may be surface mounted on a motherboard as a storage solution. The SiP 200 may include a ball grid array 210 or other connections.

However, once the package 200 is surface mounted onto a motherboard or other platform, there is no access to any of the signals within the package to debug the SiP when required. As provided in FIG. 1, the SiP does not include any debug ports that are accessible. Conventional methods for debug for IC packages include designing probe points around the critical packages on the PCB, which would entail using valuable real estate on the PCB.

Further, this type of implementation may not be favored because it transfers the ownership of developing debug probe points, and such solution may not be consistent across a customer's platform designs.

Another option for conventional testing is to desolder the packages off of the PCB and test the failed packages on a dedicated debug boards. However, there are at least two basic problems with this approach:

(1) Initial debug requires the preservation of the electrical state of the system. This electrical state will be lost through the desolder process, and thus valuable data is lost.

(2) Components have a limited number of reflow/rework processes that can be handled prior to becoming non-functional. Thus, the desolder process risks damage to the components, which will eliminate any further debug processes.

In some embodiments, an SiP or other electronic package is modified to include one or more buried debug access ports, such as access ports 150 illustrated in FIG. 1, wherein the buried access ports enable the package to be subjected to a debug process in case of failure conditions without removal of the SiP or other electronic package from a motherboard installation.

Figure 3:
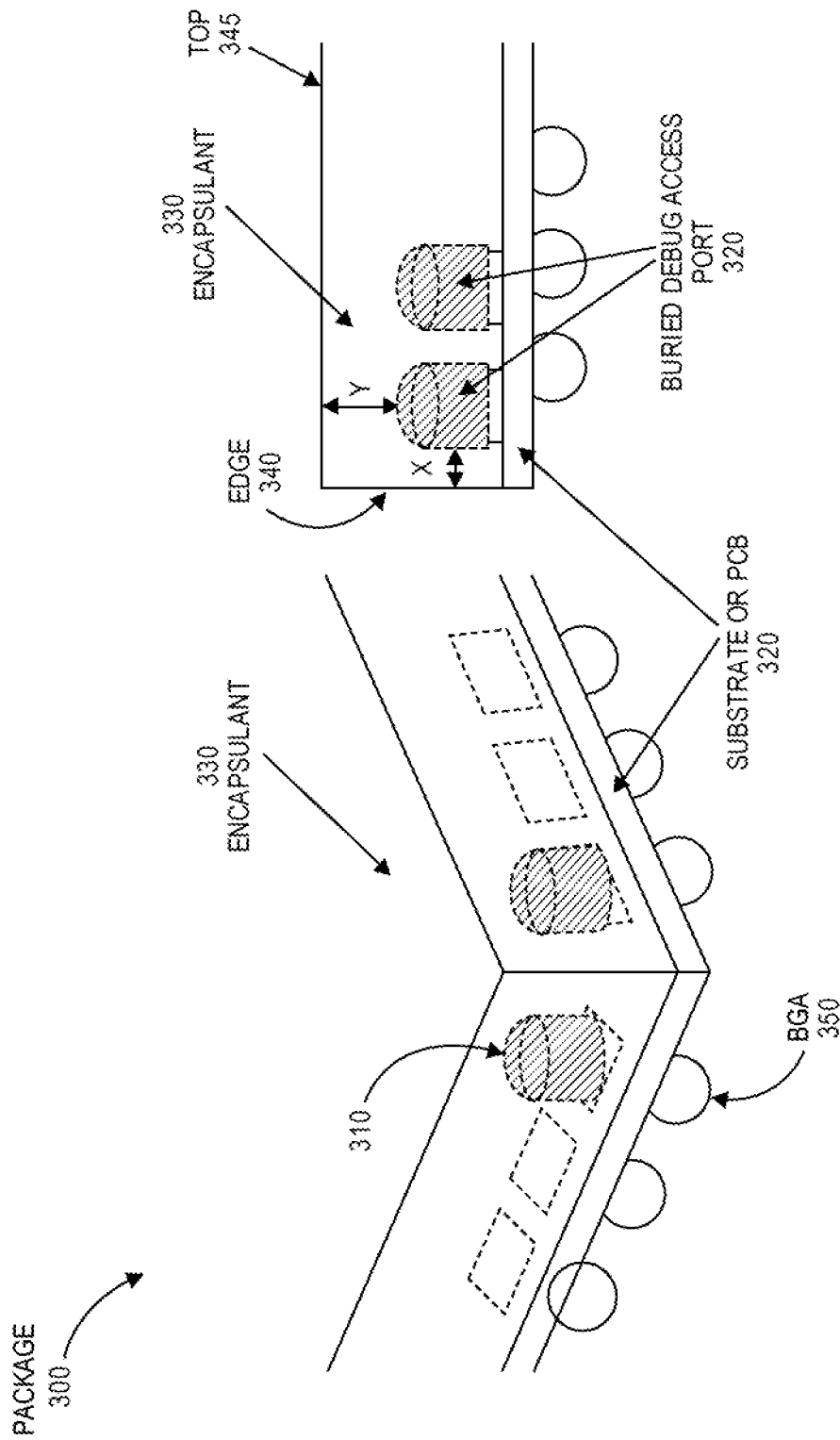
FIG. 3 illustrates a system including one or more buried access ports and one or more means to access the buried access ports according to an embodiment.

FIG. 3 illustrates a package including one or more buried access ports and one or more means to access the buried access ports according to an embodiment. For illustration, FIG. 3 provides an angle view and a side view of a package 300, such as system in package, with ball grid array (BGA) 350. However, embodiments are not limited to a particular type or structure of electronic package. In some embodiments, the package 300 includes one or more buried access ports to provide electrical connections to the encapsulated system.

In some embodiments, the package 300 includes one or more electrically conductive access ports 310 on the substrate or PCB 320. In some embodiments, the one or more electrically conductive access ports 310 are buried within the encapsulant 330 of the package. The construction of the access ports may vary depending on the implementation, and may include, but are not limited to, solder paste, pre-formed solder spheres, a copper post, a small piece of PCB, or other similar element that allows for electrical contact when a physical contact is made with a probe. In some embodiments, the buried access ports are fully enclosed in the encapsulant and insulated from electrical contact by the encapsulant material, and thus it is not possible to make electrical contact with the access ports without breaking through the encapsulant.

In some embodiments, the one or more access ports 310 are buried within the encapsulant near the top surface or edge of the encapsulated portion of the package (for example, adjacent to the package edge) such that testing may be accomplished by reaching the one or more access ports through the encapsulant, such as by drilling through, piercing through, or otherwise breaking through the encapsulant, to provide an electrical connection to the system at the appropriate debug access points of the system 300. In some embodiments, the one or more access ports 310 may alternatively be accessed utilizing electromagnetic coupling with one or more ports without breaking through the encapsulate.

In some embodiments, distances (in terms of x and y coordinates as illustrated in FIG. 3) of each access port 310 to the package edge 340 or top 345 of the encapsulant 330 may be optimized per the appropriate design requirements. In some embodiments, a buried access port may located so that the access port is a closest element of the package to an edge 340 of the package, to the top surface 345 of the package, or both to allow for ease of access to such buried access ports.

Further, in normal operation the buried debug access ports 310 are fully encapsulated, thus protecting against accidental electrical contact, and providing that the package moisture integrity remains intact.

Figure 4:
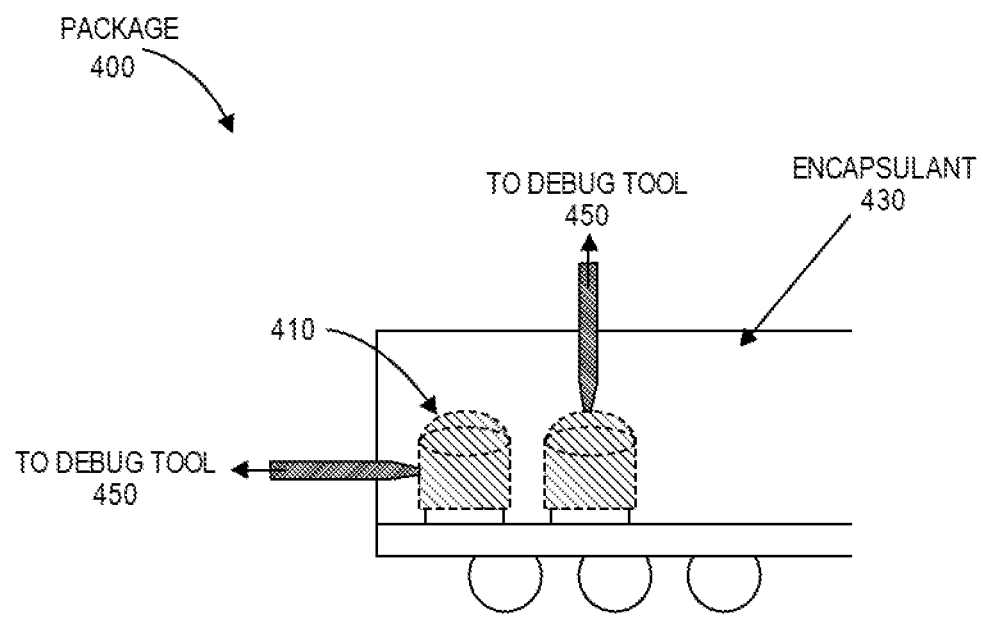
FIG. 4 illustrates a system including one or more buried access ports and one or more means to access the buried access ports according to an embodiment.

FIG. 4 illustrates a package including one or more buried access ports and one or more means to access the buried access ports according to an embodiment. In this illustration, FIG. 4 provides a side view of the package 400. In some embodiments, the package 400 includes one or more buried access ports to provide electrical connections to the encapsulated system.

As illustrated, the one or more buried access ports 410 are enclosed in the encapsulant of the package 400, the access ports being located near to a top or side of the package. In some embodiments, electrical contact may be made with the buried access ports for connection with a debug tool 450. As illustrated, the access may be made by drilling through, piercing through, or otherwise breaking through the encapsulant to reach the buried access ports. In some embodiments, access may be made through use of a connector or lead that is capable of breaking through the thin layer of encapsulant 430. In some embodiments, the access with the buried access port may be made by electromagnetic coupling with one or more ports, which be provided without breaking through the encapsulant.

Figure 5:
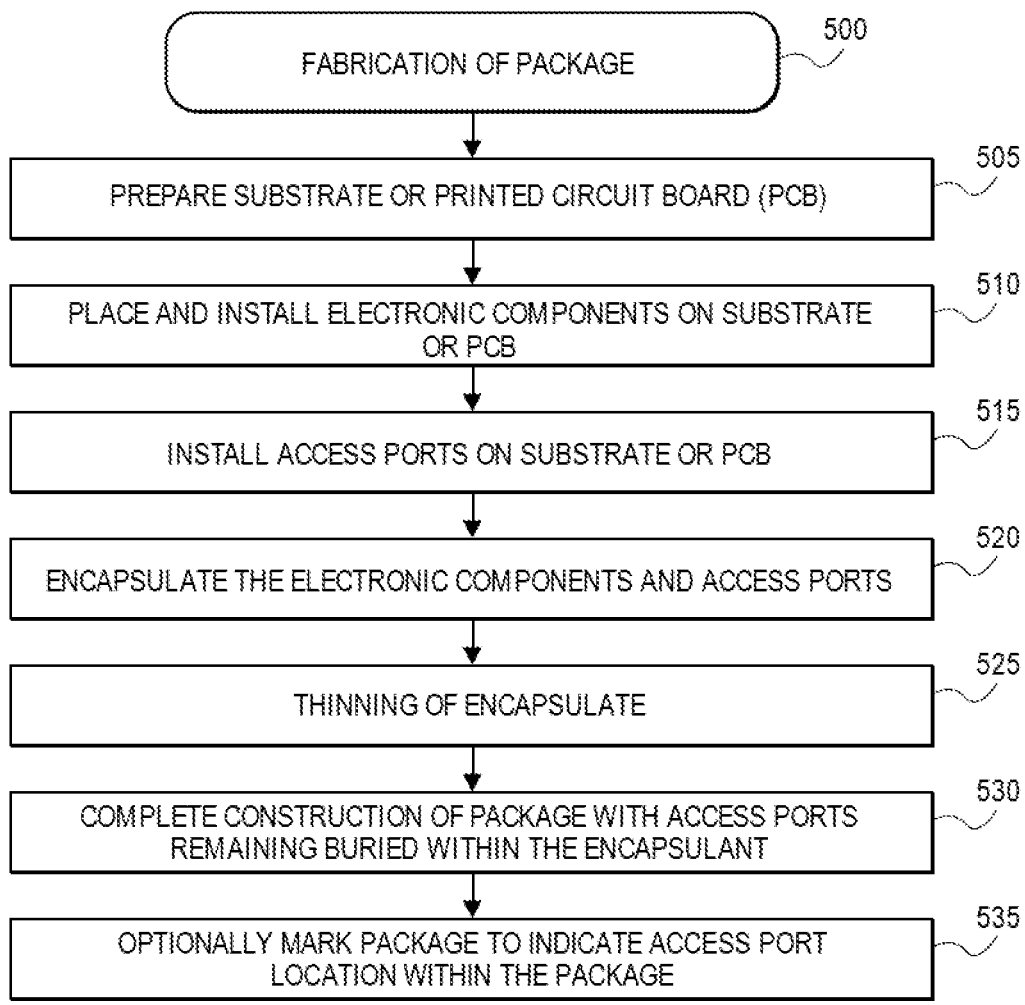
FIG. 5 is a flowchart to illustrate fabrication of a package with buried electrical debug access ports according to an embodiment.

FIG. 5 is a flowchart to illustrate fabrication of a package with buried electrical debug access ports according to an embodiment. In some embodiments, a fabrication process 500 may include, but is not limited to, the following:

505: Preparation of a substrate or printed circuit board for the package.

510: Place and install one or more electronic components on the substrate or PCB.

515: Place and install one or more electrical access ports on the substrate or PCB. In some embodiments, the access ports are generated and installed such that access ports are near to a top surface or side surface of the completed package.

520: Encapsulate the one or more electronic components and one or more electrical access ports with encapsulant material, including fully encapsulating the one or more electrical access ports to create one or more buried access ports.

525: As needed, the process may include thinning of the encapsulant as required for the construction of the package. Any thinning process will not provide access the one or more buried access ports, which are to be fully encapsulated in the finished package.

530: Complete construction of the package with the one or more access ports remaining buried within the encapsulant.

535: Optionally mark the package to indicate the access port location within the package. However, embodiments do not require any marking.

Figure 6:
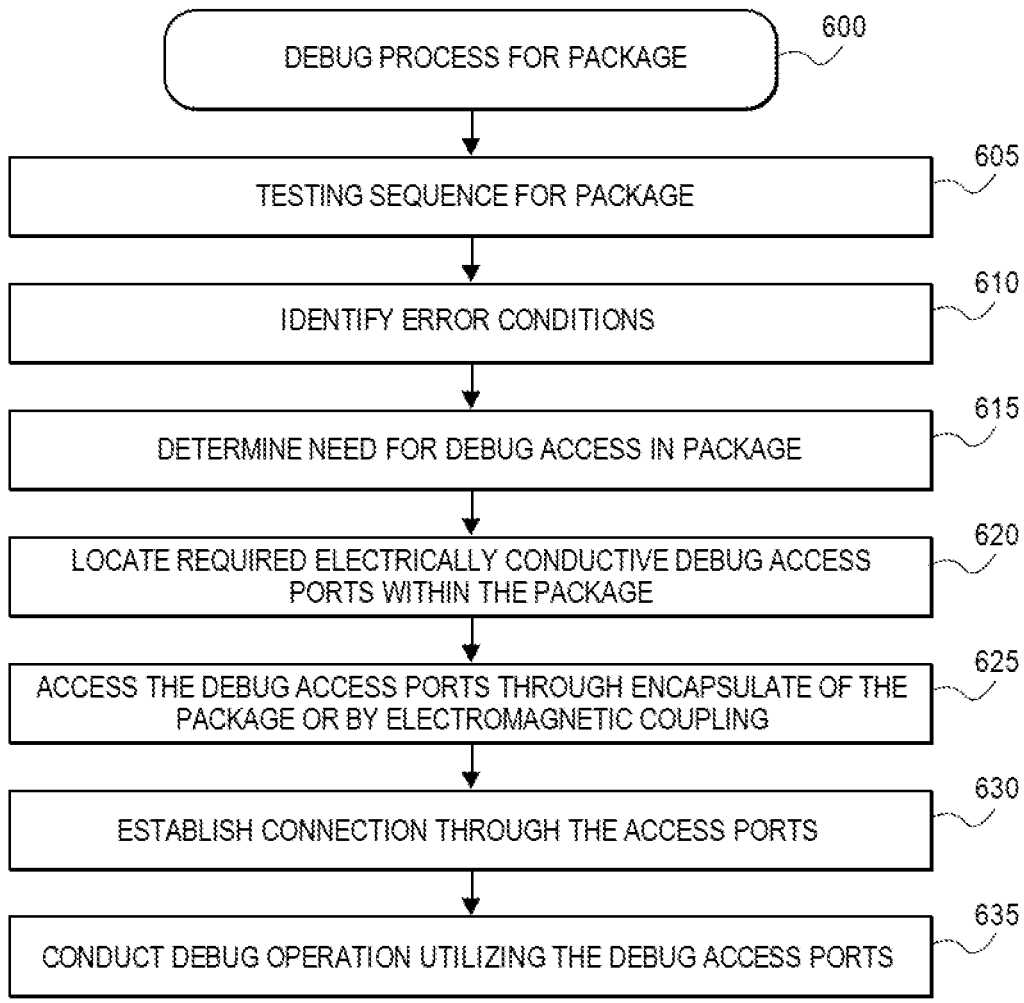
FIG. 6 is a flowchart to a debugging process for a package with buried electrical debug access ports according to an embodiment.

FIG. 6 is a flowchart to a debugging process for package with buried electrical debug access ports according to an embodiment. In some embodiments, a debug process 600 may include, but is not limited to, the following:

605: Begin testing sequence for the package.

610: The testing sequence may in certain cases identify one or more error conditions in the package.

615: Determine a need for debug access within the package for the debugging process.

620: Locate one or more electrically conductive debug access ports buried within the encapsulant of the package.

625: Access the required electrically conductive debug access ports within the package. Accessing the ports may include drilling through, piercing, or otherwise breaking through the encapsulant of the package to reach the debug access ports, or may include by electromagnetic coupling with one or more access ports.

630: Establish a connection with the package through the one or more access ports.

635: Conduct debug operation utilizing the debug access ports.

Figure 7:
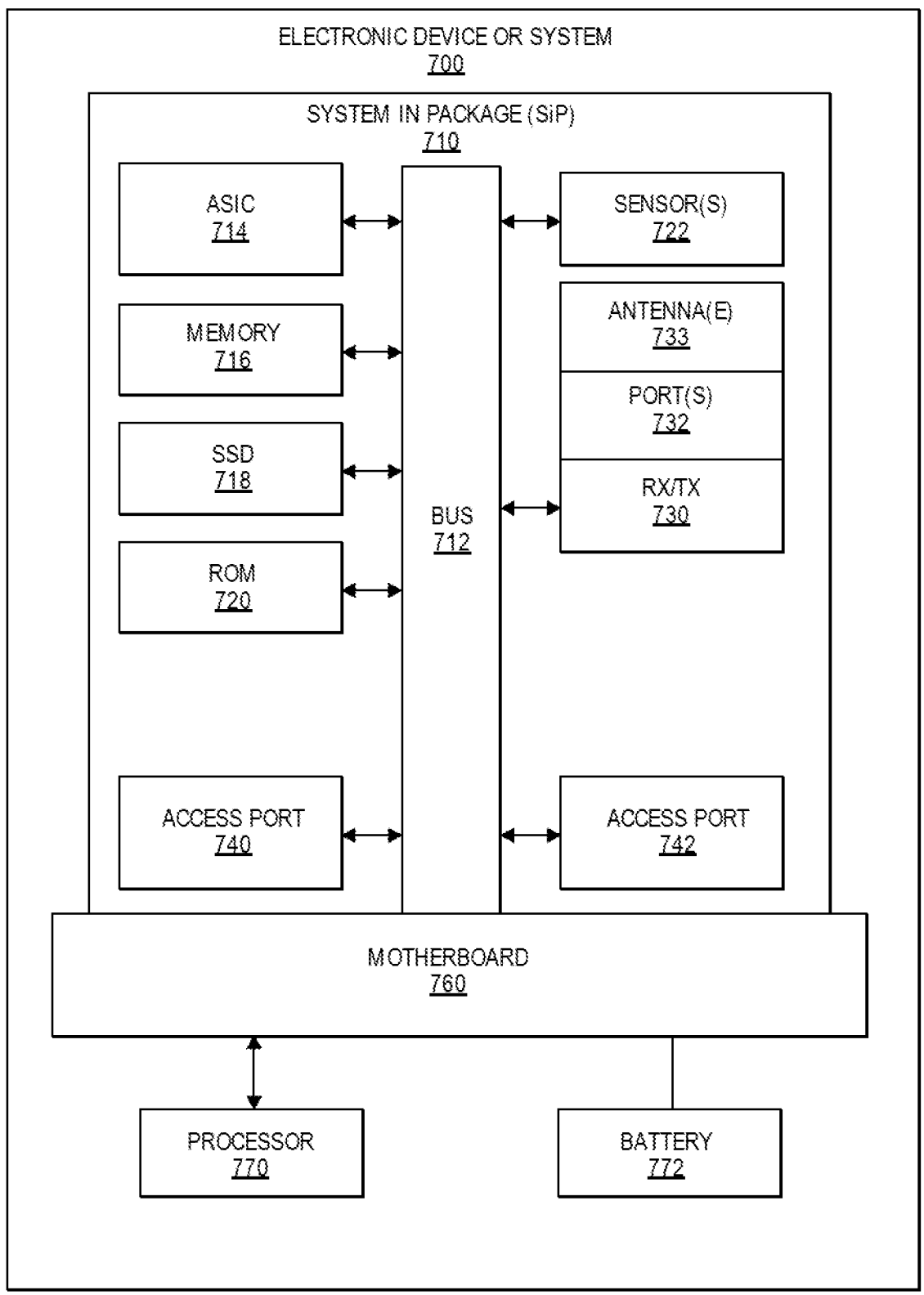
FIG. 7 is an illustration of components of an apparatus or system including a system in package according to an embodiment.

FIG. 7 is an illustration of components of an apparatus or system including a system in package according to an embodiment. In some embodiments, an electronic device or system 700 includes a system in package 710, wherein the system in package 710 may provide storage or other function for the electronic device or system 700. However, FIG. 7 illustrates an example, and embodiments are not limited to a particular package technology, or to a particular electronic device or system. In this example, the electronic device or system 700 may include, but is not limited to, a mobile electronic device.

In some embodiments, the system in package (SiP) 710 may include one or more ASICs, or controllers, or other processing element 714 (generally referred to herein as an ASIC) coupled to one or more buses or interconnects, shown in general as bus 712. In some embodiments, the bus 712 is a communication means for transmission of data. The bus 712 is illustrated as a single bus for simplicity, but may represent multiple different interconnects (including an RDL (Redistribution Layer) and via) or buses and the component connections to such interconnects or buses may vary. The bus 712 shown in FIG. 7 is an abstraction that represents any one or more separate physical buses, point-to-point connections, or both connected by appropriate bridges, adapters, or controllers.

In some embodiments, in addition to other elements, the SiP 710 includes one more buried electrical access ports, illustrated as access ports 740 and 742. In some embodiments, the access ports 740-742 are fully encapsulated in the package, and do not allow electrical contact with the access ports without breaking through the encapsulant for the SiP 710.

In some embodiments, the SiP 710 further comprises a memory 716 for storing information and instructions to be executed by the ASIC 714. Memory 716 may include, but is not limited to, dynamic random access memory (DRAM). The SiP 710 also may comprise solid state memory (SSD) to provide storage, the SSD including non-volatile memory. The SiP 710 may further a read only memory (ROM) 720 or other static storage device for storing static information and instructions.

In some embodiments, the SiP 710 may include one or more transmitters or receivers 730 coupled to the bus 712 for wireless or wired communication of data. In some embodiments, the SiP 710 may include one or more ports 732 for the transmission and reception of data via wired communications and one or more antennae for the for the transmission and reception of data via wireless communication. Wireless communication includes, but is not limited to, Wi-Fi, Bluetooth™, near field communication, and other wireless communication standards.

In some embodiments, the SiP 710 may include one or more sensors 722 to sense environmental factors, wherein the one or more sensors may include a temperature sensor, a voltage sensor, or other sensor.

In some embodiments, the device or system 700 includes a motherboard 760, wherein the SiP 710 is installed on the motherboard by soldering of a ball grid array or other known connection means. In some embodiments, the access ports 740-742 may be utilized to provide debug access to the SiP while the SiP is installed on the motherboard 760.

In some embodiments, the device or system 700 may include additional components, such as one or more processors 770 to process data, and a power source such as a battery 772 to power the system or apparatus 700. The power source may further include a solar cell, a fuel cell, a charged capacitor, near field inductive coupling, or other system or device for providing or generating power. The power provided by the power source may be distributed as required to elements of the system or apparatus 700.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes a substrate or printed circuit board; one or more electronic components coupled with the substrate or printed circuit board; one or more electrical access ports coupled with the substrate or printed circuit board, each electrical access port including electrically conductive material; and an encapsulant material, wherein the encapsulant material encapsulates the one or more access ports. In some embodiments, the one or more access ports are electrically connected to one or more circuits of the apparatus to provide debugging access to the apparatus.

In some embodiments, each of the one or more access ports is insulated from electrical contact by the encapsulant material.

In some embodiments, the apparatus is a system in package (SiP).

In some embodiments, each of the one or more access ports is adjacent to an edge of the encapsulant material.

In some embodiments, a first access port is a closest element of the apparatus to an edge of the encapsulant material.

In some embodiments, a first access port is a closest element of the apparatus to a top surface of the encapsulant material.

In some embodiments, the one or more electrical access ports are accessible by breaking through the encapsulate material.

In some embodiments, breaking through the encapsulate material includes drilling through or piercing through the encapsulate material.

In some embodiments, the one or more electrical access ports are accessible by electromagnetic coupling with at least one access port.

In some embodiments, a method includes installing one or more electronic components on a substrate or printed circuit board; installing one or more electrical access ports on the substrate or printed circuit board; and encapsulating the one or more electronic components and one or more electrical access ports in an encapsulant material. In some embodiments, the one more electrical access ports are fully encapsulated to generate one or more buried access ports.

In some embodiments, encapsulating the one or more buried access ports is to insulate the one or more buried access ports from electrical contact.

In some embodiments, installing the one or more electrical access ports on the substrate or printed circuit board includes installing each of the one or more electrical access ports adjacent to an edge of the encapsulant material.

In some embodiments, installing the one or more electrical access ports on the substrate or printed circuit board includes installing a first electrical access port to be a closest element of the package to an edge of the encapsulant material.

In some embodiments, installing the one or more electrical access ports on the substrate or printed circuit board includes installing a first electrical access port to be a closest element of the package to a top surface of the encapsulant material.

In some embodiments, the one or more buried access ports are accessible by breaking through the encapsulate material.

In some embodiments, the one or more electrical access ports are accessible by electromagnetic coupling with at least one access port.

In some embodiments, the method further includes accessing one or more buried access ports by breaking through the encapsulate material.

In some embodiments, the method further includes accessing one or more electrical access ports by electromagnetic coupling at least one access port.

In some embodiments, a system includes a processor; an electronic package; and a motherboard, the electronic package being installed in the motherboard. In some embodiments, the electronic package includes a substrate or printed circuit board, a plurality of electronic components including a solid state drive (SSD) coupled with the substrate or printed circuit board, one or more electrical access ports coupled with the substrate or printed circuit board, each electrical access port including electrically conductive material, and an encapsulant material, wherein the encapsulant material encapsulates the one or more access ports. In some embodiments, the one or more access ports are electrically connected to one or more circuits of the electronic package to provide debugging access to the electronic package.

In some embodiments, each of the one or more access ports is insulated from electrical contact by the encapsulant material.

In some embodiments, each of the one or more access ports of the electronic package is adjacent to an edge of the encapsulant material.

In some embodiments, a first access port is a closest element of the electronic package to an edge of the encapsulant material, to a top surface of the encapsulant material, or both.

In some embodiments, the one or more electrical access ports are accessible by breaking through the encapsulate material.

In some embodiments, the one or more electrical access ports are accessible by electromagnetic coupling with at least one access port.

In some embodiments, access to the electrical access ports provides debug access to the electronic package without removing the electronic package from the motherboard.

What is claimed is:

1. A method for fabricating an apparatus, the method comprising:
   coupling one or more electronic components with a substrate or a printed circuit board;
   coupling an electrical access port with the substrate or printed circuit board, the electrical access port including electrically conductive material; and
   encapsulating the electrical access port with an encapsulant material, the encapsulant material having a top surface, a bottom surface, and side surfaces between the top surface and the bottom surface, wherein the bottom surface is on the substrate or printed circuit board, and wherein the encapsulant material has an opening in one of the side surfaces, the opening extending through the encapsulant material and exposing at least one of the electrical access port, wherein the electrical access port has a surface proximate the one of the side surfaces of the encapsulant material, and the opening exposes a portion of but not all of the surface of the electrical access port, wherein the electrical access port is electrically connected to one or more circuits of the apparatus.

2. The method of claim 1, wherein each of the electrical access port is insulated from electrical contact by the encapsulant material.

3. The method of claim 1, wherein the apparatus is a system in package (SiP).

4. The method of claim 1, wherein the electrical access port is adjacent to an edge of the encapsulant material.

5. The method of claim 1, wherein the electrical access port is a closest element of the apparatus to an edge of the encapsulant material.

6. The method of claim 1, wherein the electrical access port is a closest element of the apparatus to a top surface of the encapsulant material.

7. The method of claim 1, wherein the electrical access port is accessible by breaking through the encapsulate material.

8. The method of claim 1, wherein breaking through the encapsulate material includes drilling through or piercing through the encapsulate material.

9. The method of claim 1, wherein the electrical access port is accessible by electromagnetic coupling with at least one access port.

10. A method of fabricating a system, the method comprising:
    coupling a processor to a motherboard;
    coupling an electronic package to the motherboard, wherein the electronic package includes:
    a substrate or printed circuit board, a plurality of electronic components including a solid state drive (SSD) coupled with the substrate or printed circuit board, an electrical access port coupled with the substrate or printed circuit board, the electrical access port including electrically conductive material, and an encapsulant material, wherein the encapsulant material encapsulates the electrical access port, the encapsulant material having a top surface, a bottom surface, and side surfaces between the top surface and the bottom surface, wherein the bottom surface is on the substrate or printed circuit board, and wherein the encapsulant material has an opening in one of the side surfaces, the opening extending through the encapsulant material and exposing at least one of the electrical access port, wherein the electrical access port has a surface proximate the one of the side surfaces of the encapsulant material, and the opening exposes a portion of but not all of the surface of the electrical access port;
    wherein the electrical access port is electrically connected to one or more circuits of the electronic package to provide debugging access to the electronic package.

11. The method of claim 10, wherein each of the electrical access port is insulated from electrical contact by the encapsulant material.

12. The method of claim 10, wherein the electrical access port is adjacent to an edge of the encapsulant material.

13. The method of claim 10, wherein the electrical access port is a closest element of the apparatus to an edge of the encapsulant material.

* * * * *